United States Patent [19]

Stiggelbout

[11] Patent Number: 4,551,914

[45] Date of Patent: Nov. 12, 1985

[54] METHOD OF MAKING FLEXIBLE CIRCUIT CONNECTIONS

[75] Inventor: William A. Stiggelbout, Vancouver, Wash.

[73] Assignee: Hewlett-Packard Company, Palo Alto, Calif.

[21] Appl. No.: 539,345

[22] Filed: Oct. 5, 1983

[51] Int. Cl.[4] .............................................. A05K 3/34
[52] U.S. Cl. ..................................... 29/837; 174/68.5; 228/179; 339/17 C
[58] Field of Search ................. 29/837, 838, 839, 840; 228/258, 179; 339/17 C, 17 E, 96, 275 B; 174/68.5

[56] References Cited

U.S. PATENT DOCUMENTS

| | | | |
|---|---|---|---|
| 2,695,351 | 11/1954 | Beck | 339/17 E |
| 3,159,906 | 12/1964 | Telfer | 174/68.5 X |
| 3,541,225 | 11/1970 | Raciti | 228/258 X |
| 3,834,015 | 9/1974 | DiRenzo | 228/179 X |
| 4,121,044 | 10/1978 | Hadersbeck et al. | 174/68.5 |
| 4,185,378 | 1/1980 | Machida | 29/839 |

FOREIGN PATENT DOCUMENTS 1936853  8/1973  Fed. Rep. of Germany .... 339/17 E

Primary Examiner—Howard N. Goldberg
Assistant Examiner—Carl J. Arbes
Attorney, Agent, or Firm—William H. MacAllister; William J. Bethurum

[57] ABSTRACT

A method of providing electrical connections to a flexible circuit member having electrical contact pads of solderable material on one side. The contact pads and the flexible circuit are pierced with contact pins. Solder is caused to flow along the contact pins through the openings in the flexible circuit from the side opposite to that on which the contacts are disposed.

5 Claims, 4 Drawing Figures

METHOD OF MAKING FLEXIBLE CIRCUIT CONNECTIONS

BACKGROUND OF THE INVENTION

This invention relates to electrical connections to flexible circuitry tapes and the like. More particularly, the invention relates to a method of making soldered electrical connections to a flexible circuit tape where solder connection areas or pads are on an inaccessible side of the tape.

Flexible circuits generally comprise a strip or tape of flexible plastic or other electrically insulating material, for example a polyester sold under the name Mylar or a polyimide sold under the name Kapton both of which are trademarks of E. I. DuPont deNemours & Co., Wilmington, Del. Electrical circuit patterns are formed on or in such insulating material. Usually, such flexible circuit tapes have electrical contact areas or pads on one surface of the tape, which makes electrical contact with respective individual circuit patterns embedded in the tape so as to permit connecting these circuit patterns to other external or remotely located circuit elements or electrical devices. These contact areas are generally in the form of small pads of solderable material. One such flexible circuit tape is in the form of a keyhole comprising a generally circular portion having a rectangularly shaped portion integral therewith. The circuit patterns permit connection, as by the aforementioned solder pads, to a plurality of circularly arranged electromagnetic coils, for example, which may be positioned atop of the circular portion. The circuit patterns terminate in the rectangular portion in contact with additional solder pads in the rectangular portion to permit connection of the electromagnetic coils to other circuit elements. The contact areas or solder pads are all disposed on the same surface of the flexible circuit tape, it being extremely difficult or otherwise impractical to provide some solder pads on one side of the tape, and other solder pads on the opposite side thereof. In seeking to provide external connections to the flexible circuit tape by means of a multi-pin terminal or connector block, which usually is in the form of a rigid printed circuit board, the terminal block rests upon the solder pads disposed on the rectangular portion and thus makes the solder pads thereon inaccessible for soldering.

U.S. Pat. No. 4,342,883 to Wernet et al. deals with the making of electrical connections to a flexible circuit tape. While teaching the soldering of pins inserted through the flexible circuit, the solderable contact areas of the flexible circuit tape in this patent are all disposed on a surface of the tape which is accessible to soldering. In other words, the pins are inserted through the flexible circuit from the opposite side of the circuit tape to that on which the contact areas are provided. Hence, for example, the multi-pin connector block in this patent does not mask or render inaccessible the contact areas from soldering. Nor do these patentees teach how the pins are inserted through the flexible tape.

In most instances, it is customary in such flexible circuit applications to pre-drill holes through the tape and/or contact areas and insert the pins therethrough to the contact areas on the opposite sides thereof, where they may be soldered to the contact areas. However, where there are a plurality of such contact areas closely spaced from each other in a relatively small area, such pre-drilling is difficult and expensive. The difficulty in such an instance will be appreciated when one contemplates the necessity of inserting 20 pins through a flexible circuit tape in an area that is about 5 mm. wide by 25 mm. in length, with the corresponding number of contact areas, each being about 0.060 inches in diameter and spaced apart about 0.125 inches center-to-center.

In U.S. Pat. No. 4,343,530 to L. J. Leger, a mail terminal is disclosed having a V-shaped stem which is inserted in a pre-drilled circular hole in a printed circuit board. The V-shape of the stem is provided to increase the strength and the solder wicking action through the hole in the printed circuit board. Leger's pre-drilled hole is plated through with copper prior to insertion therethrough of the terminal stem, after which the terminal stem is secured to the board by soldering the stem and the base of the terminal, thereby being secured in and to the copper-plated hole of the printed circuit board. Again, it will be noted, pre-drilling is required, pre-plating of the hole is necessary and a specially shaped terminal stem must be utilized.

BRIEF SUMMARY OF THE INVENTION

According to the invention, permanent electrical connections are made to a plurality of contact pads of solderable material on a flexible circuit tape by inserting a pin block having a corresponding number of pins through the contact pads so that the pin block itself comes down on and rests upon the contact pads. The solder contact pads are thus no longer accessible for soldering at the surface upon which they are disposed. The pins are actually force-punched through the solder pads and the underlying plastic film much like staples are punched through paper. For convenience, this action is hereinafter referred to as "pin-stapling." In perforating the plastic film, the film is pushed outwardly by the ends of the pins until it tears around each pin into small triangularly shaped tabs, the ends or apices of each tab being pushed outwardly and resting against the pins so that small openings through the film and around the pins are provided. The pin block/flexible circuit member is then subjected to a wave soldering process from the underside of the flexible circuit member, whereby solder is wicked up through the openings in the plastic film and reaches the solder contact areas on the opposite side, thus resulting in strong and effective electrical connections between the pins and the solder contact areas on the flexible circuit member.

DETAILED DESCRIPTION OF THE INVENTION

Figure 1:
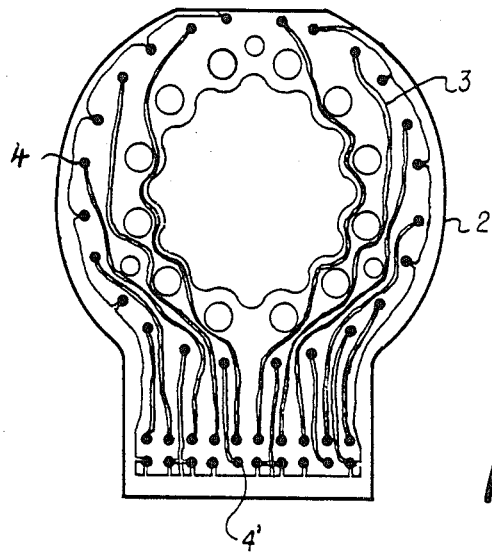
FIG. 1 is a plan view of a typical flexible circuit before electrical connections have been made thereto by the pin-stapling technique of the invention.

Referring now to FIG. 1, a typical flexible circuit member 2 is shown. The flexible circuit member 2 comprises a film of plastic or other electrically insulating material in which is embedded a plurality of electrically conductive patterns or paths 3. As shown, all of the conductive paths 3 have respective terminal portions 4 disposed around the periphery of the circular portion of the flexible circuit 2. In addition, each conductive path has a second terminal 4' disposed in the rectangular portion of the flexible circuit member. In actual practice, for example, a plurality of electromagnetic coils which may be circularly arranged with respect to each other, are positioned upon and fastened to the circular portion of the flexible circuit member 2, with solderable contact pads such as the pads 9 (see FIG. 3) from the various conductive paths being in electrical contact with or otherwise affixed to the electromagnetic coils associated with each magnet in a circular array thereof so as to permit the coils to be selectively energized. Connection to other circuit elements or systems (such as control or power supply circuits) is facilitated by bringing all of the paths 3 from the circular portion into the rectangular portion of the flexible circuit member 2 and arranging the terminal portion 4' of these paths in two rows of ten each. It will be understood that each of the terminals 4' of the conductive paths 3 in these rows terminate in electrically conductive pads such as pad 9 (shown in FIGS. 3 and 4) of solderable material which are disposed on the surface of the flexible circuit member 2 and are in electrical contact with the underlying conductive paths 3 through small openings provided in the film at appropriate points. As mentioned previously, the contact pads for each terminal 4, 4' of the conductive paths 3 are all formed on the same surface of the flexible circuit film 2. The contact pads in the rectangular portion of the flexible circuit member 2 are arranged in two parallel rows of ten each. Organizing the contact pads in such parallel rows facilitates the making of electrical connections between the flexible circuit member 2 and other devices or systems to which connection is desired, particularly by means of pinblocks and the like.

Figure 2:
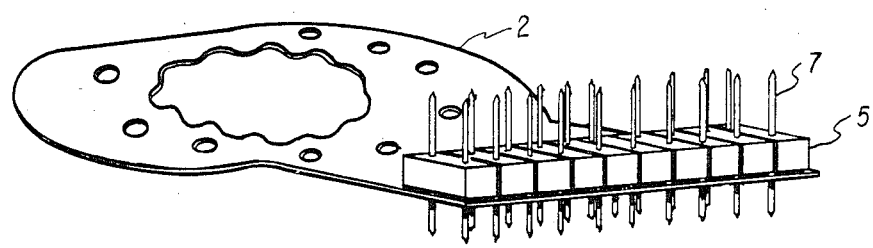
FIG. 2 is a perspective of the flexible circuit of FIG. 1 with a pin block after the pins of the pin block have been pin-stapled through the flexible circuit.

Referring now to FIG. 2, the flexible circuit member 2 is shown with a connector pin-block 5 mounted thereon. The pins 7 and the pin block 5 are so arranged as to coincide with the position and spacing of the contact terminals 4' and the pads therefor in the rectangular portion of the flexible circuit member 2. Insertion of the pins 7 in the pin block 5 through the contact pads and the flexible circuit member 2 itself, may be accomplished through the use of a jig and a press. As noted hereinbefore, the insertion of the pins 7 through the contact pads and the flexible circuit film 2 is referred to as "pin-stapling." Upon the completion of this mounting operation, the bonding of the pins 7 and hence, the pin block 5, to the flexible circuit member 2 is mechanically and electrically quite strong.

Figure 3:
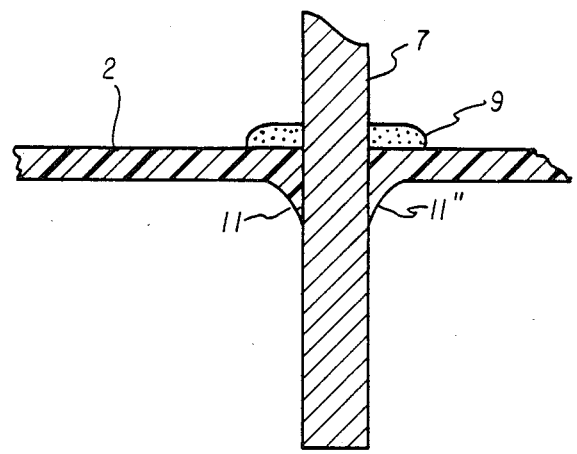
FIG. 3 is a side view in section of the flexible circuit of FIGS. 1 and 2, showing in greater detail, a pin inserted through a solder contact pad and the flexible circuit film, and illustrating how triangularly-torn film tabs extend more or less normally from the plane of the flexible circuit and in the direction in which the pin is inserted.
Figure 4:
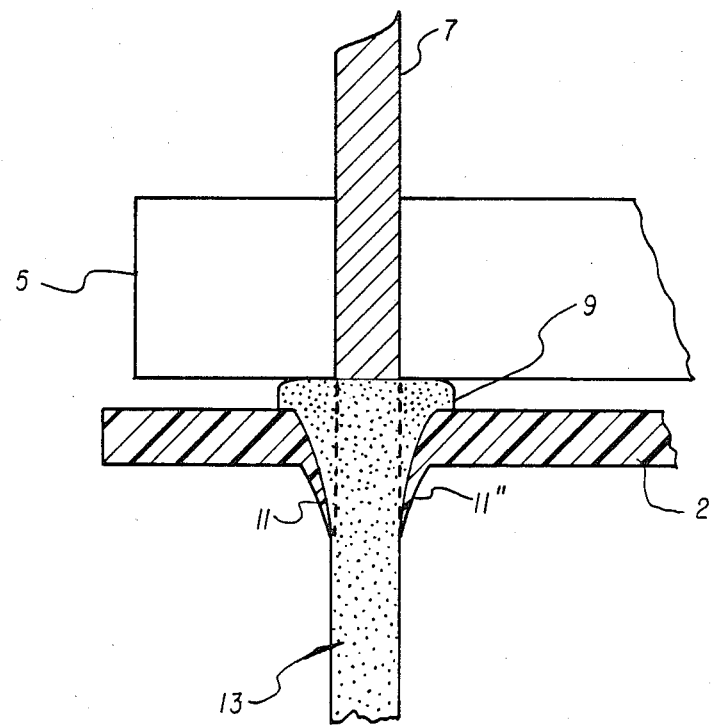
FIG. 4 is a side view, partly in section, of the flexible circuit shown in the preceding figures and illustrating the soldered connection between a pin and its respective solder contact pad, the pin block also being shown in place on the surface of the flexible circuit.

Referring now to FIG. 3, when the pins 7 are inserted through the contact pads 9 and the flexible circuit 2, the ends of the pin 7 pierce the flexible circuit film 2 to tear and form a small hole or holes about each pin. Such holes are actually the result of the film tearing into small triangularly shaped tabs 11, 11" as the pin 7 goes through the film. These tabs 11, 11" extend in the direction in which the pins 7 are forced through the flexible circuit film 2. The tips or apices of the triangularly shaped tabs 11, 11" actually press against the sides of the pins 7 and tend to maintain the pins 7 in place with a relatively strong mechanical force. (Upon the completion of this pin-stapling operation, it has been found relatively difficult to remove the pin block 5 from the flexible circuit member 2.) When the pin block 5 has been thus secured to the flexible circuit member 2 by pin-stapling, the pin block is superimposed above and may actually rest upon the solder contact pads 9 on the upper surface of the flexible circuit member 2, thus rendering these contact pads inaccessible for soldering from that surface. The pins 7, however, in being stapled through the contact pads 9 and the flexible circuit member 2, with the small holes formed around each pin by reason of the displacement of the triangular tabs 11, 11" permit the pins to be soldered through these holes to the solder contact pads 9 on the opposite side. Thus, after the pin block 5 has been pin-stapled to the flexible circuit member 2, the assembly is subjected to a wave-soldering action, which is well understood in the art and will not be described in greater detail herein. Suffice it to say, however, hot liquid solder contacts the underside of the flexible circuit board and the pins 7 extruding therefrom. Because of the small openings provided around each pin through the flexible circuit member 2, solder is actually "wicked" up or flows along the pins 7 through these holes to make contact with the solder contact pads 9 to fuse the pins 7 to the contact pads 9 and to thus finalize the mechanical and electrical bonding of the pin block and its pins 7 to the flexible circuit member 2.

In this manner, a strong and effective and mechanical connection is achieved between the pins in a pin block and the contact areas on a flexible circuit member, where these contact areas are on a surface of the flexible circuit member which is inaccessible for soldering.

What is claimed is:

1. A method of providing an electrical connection to a flexible circuit member having an electrical contact pad of solderable material on one side thereof, comprising the steps of: piercing said contact pad and said flexible circuit member with an electrically conductive pin member and producing an opening therein, and causing solder to flow along said pin member and through said opening in said flexible circuit member from the side thereof opposite to that on which said contact pad is disposed to thereby solder said contact pad to said pin member.

2. The method of providing an electrical connection to a flexible circuit member having an electrical contact pad of solderable material on one side thereof, comprising the steps of: piercing said contact pad and said flexible circuit member with an electrically conductive pin member, whereby openings are formed in said flexible circuit member around said pin member and causing solder to flow along said pin member and through said openings in said flexible circuit member from the side thereof opposite to that on which said contact pad is disposed.

3. The method of providing an electrical connection to a flexible circuit member having an electrical contact pad of solderable material on one side thereof, comprising the steps of: piercing said contact pad and said flexible circuit member with an electrically conductive pin member, whereby openings are formed in said flexible circuit member around said pin member, and wave-soldering said pin member to said contact pad from the side of said flexible circuit member opposite to the side thereof on which said contact pad is disposed.

4. The method of providing electrical connections to a flexible circuit member having a plurality of electrical contact pads of solderable material disposed on one side thereof, comprising the steps of: piercing said contact pads and said flexible circuit member with a plurality of electrically conductive pin members mounted in an electrically insulative member whereby respective openings are formed in said flexible circuit member around each of said pin members and said electrically insulative member is superimposed over said contact pads, and causing solder to flow along said pin members through said openings in said flexible circuit member from the side thereof opposite to that on which said contact pads are disposed whereby said solder contacts said contact pads and fuses said pin members to respective one of said contact pads.

5. A method for soldering pins in a pin block assembly to contact pads on a flexible circuit member adapted to receive said pin block assembly on one side thereof, comprising:
 bringing said pin block assembly into direct contact with said contact pads while simultaneously;
 piercing said contact pads and said flexible circuit member with electrically-conducting pin members and thereby producing openings in said contact pads and said flexible circuit member; and
 flowing solder along said pin members and through said openings in said flexible circuit member and to said contact pads to thereby solder said conact pads to said pin members.

* * * * *